United States Patent
Noh et al.

(10) Patent No.: US 9,953,827 B2
(45) Date of Patent: Apr. 24, 2018

(54) METHOD OF FORMING SEMICONDUCTOR DEVICE HAVING DIELECTRIC LAYER AND RELATED SYSTEM

(71) Applicant: Samsung Electronics Co., Ltd., Suwon-si, Gyeonggi-do (KR)

(72) Inventors: Woochoel Noh, Hwaseong-si (KR); Wonkyu Han, Seoul (KR); Hyeoksang Oh, Suwon-si (KR); Naein Lee, Seoul (KR); Gyeongyun Han, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/273,797

(22) Filed: Sep. 23, 2016

(65) Prior Publication Data

US 2017/0084481 A1 Mar. 23, 2017

(30) Foreign Application Priority Data

Sep. 23, 2015 (KR) .......................... 10-2015-0134764

(51) Int. Cl.
*H01L 21/768* (2006.01)
*H01L 21/02* (2006.01)

(52) U.S. Cl.
CPC .. *H01L 21/02068* (2013.01); *H01L 21/76814* (2013.01); *H01L 21/76825* (2013.01)

(58) Field of Classification Search
CPC ......... H01L 21/76822; H01L 21/02068; H01L 21/76802; H01L 21/76877

USPC ............................................ 438/666; 257/774
See application file for complete search history.

(56) References Cited

U.S. PATENT DOCUMENTS

| | | | |
|---|---|---|---|
| 6,598,314 B1 | 7/2003 | Kuo et al. | |
| 7,030,023 B2 | 4/2006 | Pan et al. | |
| 8,465,991 B2 | 6/2013 | Varadarajan et al. | |
| 2005/0250346 A1 | 11/2005 | Schmitt | |
| 2006/0214305 A1* | 9/2006 | Sakata | C23C 16/045 |
| | | | 257/774 |
| 2008/0057717 A1 | 3/2008 | Owada et al. | |
| 2008/0254619 A1 | 10/2008 | Lin et al. | |
| 2010/0261349 A1 | 10/2010 | van Schravendijk et al. | |
| 2012/0146224 A1 | 6/2012 | Bao et al. | |
| 2013/0196512 A1 | 8/2013 | Koide et al. | |

FOREIGN PATENT DOCUMENTS

| | | |
|---|---|---|
| JP | 2001-345450 A | 12/2001 |
| JP | 2007-317817 A | 12/2007 |
| JP | 2008-127628 A | 6/2008 |

(Continued)

*Primary Examiner* — Caleen Sullivan
(74) *Attorney, Agent, or Firm* — Harness, Dickey & Pierce, P.L.C.

(57) ABSTRACT

A method of fabricating a semiconductor device including an interlayer insulating layer and interconnections is provided. An interlayer insulating layer is formed on a substrate. An opening is formed in the interlayer insulating layer. A degassing process is performed by irradiating the interlayer insulating layer having the opening with microwaves. A K-value recovery process is performed by irradiating the interlayer insulating layer having the opening with UV light. A conductive layer is formed in the opening. The degassing process and the K-value recovery process are performed as an in-situ process.

18 Claims, 8 Drawing Sheets

(56) References Cited

FOREIGN PATENT DOCUMENTS

| JP | 2012-114234 A | 6/2012 |
|---|---|---|
| JP | 2015-033764 A | 2/2015 |
| KR | 10-2001-0003574 A | 1/2001 |
| KR | 10-2005-0110420 A | 11/2005 |

\* cited by examiner

METHOD OF FORMING SEMICONDUCTOR DEVICE HAVING DIELECTRIC LAYER AND RELATED SYSTEM

CROSS-REFERENCE TO RELATED APPLICATION

This application claims priority under 35 U.S.C. § 119 to Korean Patent Application No. 10-2015-0134764 filed on Sep. 23, 2015, the disclosure of which is hereby incorporated by reference in its entirety.

BACKGROUND

Field

Example embodiments of the inventive concepts relate to a method of forming a semiconductor device including an interlayer insulating layer and interconnections.

Description of Related Art

As semiconductor devices are highly integrated, dielectric layers typically need to be reduced, too. The reduction of thicknesses and widths of dielectric layers may induce degradation of electrical properties, such as RC delay. The dielectric layers have a structure that is typically vulnerable to the penetration of moisture. The moisture may reduce effective thicknesses of the dielectric layers and cause failures in interconnections.

SUMMARY

Example embodiments of the inventive concepts provide a method of fabricating a semiconductor device that enables to reduce process time and provide improved electrical properties.

Other example embodiments of the inventive concepts provide a semiconductor manufacturing system that enables to reduce process time and provide improved electrical properties.

The technical objectives of the inventive concepts are not limited to the above disclosure; other objectives may become apparent to those of ordinary skill in the art based on the following descriptions.

In accordance with example embodiments, a method of fabricating a semiconductor device is provided. The method includes forming an interlayer insulating layer on a substrate. An opening is formed in the interlayer insulating layer. A degassing process is performed by irradiating the interlayer insulating layer having the opening with microwaves. A K-value recovery process is performed by irradiating the interlayer insulating layer having the opening with UV light. A conductive layer is formed in the opening. The degassing process and the K-value recovery process are performed as an in-situ process.

The degassing process may be performed in a degasser including a microwave generator.

The degassing process and the K-value recovery process may be performed in the same chamber.

The microwaves may be in the range of about 2400 MHz to about 9900 MHz.

The degassing process may include radiating microwaves having a first frequency, which is effective to remove moisture deep inside the interlayer insulating layer. The first frequency may be in the range of about 2400 MHz to about 2500 MHz.

The method may further include radiating microwaves having a second frequency, which is effective to remove moisture adjacent to a surface of the interlayer insulating layer and inner walls of the opening. The second frequency may be in the range of about 8500 MHz to about 9500 MHz.

The radiating of microwaves having the first frequency and the radiating of microwaves having the second frequency may be sequentially performed.

The degassing process may include radiating microwaves having a frequency in the range of about 8500 to about 9500 MHz, which is effective to remove moisture adjacent to a surface of the interlayer insulating layer and inner walls of the opening.

The degassing process, the K-value recovery process, and the forming of the conductive layer may be performed as an in-situ process.

The method may further include cleaning the substrate using an after-plasma-condition (APC) apparatus before forming the conductive layer. The degassing process, the K-value recovery process, the cleaning of the substrate, and the forming of the conductive layer may be performed as an in-situ process.

After the degassing process is performed, the K-value recovery process may be performed. The degassing process may be performed again after the K-value recovery process is performed.

In accordance with another example embodiment, a method of fabricating a semiconductor device is provided. The method includes forming an interlayer insulating layer on a substrate. A contact hole passing through the interlayer insulating layer is formed. A degassing process is performed by irradiating the interlayer insulating layer having the contact hole with microwaves. A conductive layer is formed in the contact hole. The degassing process and the forming of the conductive layer are performed as an in-situ process.

The method may further include performing a K-value recovery process by irradiating the interlayer insulating layer having the contact hole with UV light. The degassing process and the K-value recovery process may be performed as an in-situ process.

The method may further include cleaning the substrate using an after-plasma-condition (APC) apparatus before forming the conductive layer. The degassing process, the cleaning of the substrate, and the forming of the conductive layer may be performed as an in-situ process.

In accordance with example embodiments, a semiconductor manufacturing apparatus is provided. The semiconductor manufacturing apparatus includes a chamber, a stage installed in the chamber and on which a substrate is loaded, a microwave generator disposed on the stage in the chamber, and a UV radiator disposed on the stage in the chamber.

The microwave generator may radiate microwaves in the range of about 2400 MHz to about 9900 MHz to the substrate.

The microwave generator may radiate microwaves having a first frequency, which is effective to remove moisture deep inside the interlayer insulating layer disposed on the substrate. The first frequency may be in the range of 2400 MHz to 2500 MHz.

The microwave generator may radiate microwaves having a second frequency, which is effective to remove moisture adjacent to a surface of the interlayer insulating layer. The second frequency may be in the range of about 8500 MHz to about 9500 MHz.

The semiconductor manufacturing apparatus may further include a reflector installed in the chamber and configured to concentrate microwaves generated in the microwave generator to the substrate.

The semiconductor manufacturing apparatus may further include an outlet disposed adjacent to the stage.

The stage may be configured to heat the substrate.

In accordance with example embodiments, a semiconductor manufacturing system is provided. The semiconductor manufacturing system includes a main chamber, a load lock chamber installed on a sidewall of the main chamber, a degasser installed on a sidewall of the main chamber, and a process chamber installed on a sidewall of the main chamber. The degasser includes a chamber, a stage installed in the chamber and on which a substrate is loaded, and a microwave generator installed on the stage in the chamber.

The degasser may further include a UV radiator installed in the chamber.

An after-plasma-condition (APC) apparatus may be installed on a sidewall of the main chamber.

A UV radiator may be installed in the APC apparatus.

A UV radiator may be installed in the process chamber.

Details of other example embodiments are included in the detailed description and drawings.

Example embodiments relate to method of removing moisture from a semiconductor device during a manufacturing process, the method including forming an interlayer insulating layer on a substrate in a chamber, the interlayer insulating layer including at least one opening, irradiating the interlayer insulating layer with microwave radiation in the chamber, irradiating the interlayer insulating layer with UV light in the chamber, and forming at least one conductive layer in the at least one opening.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference numerals denote the same respective parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
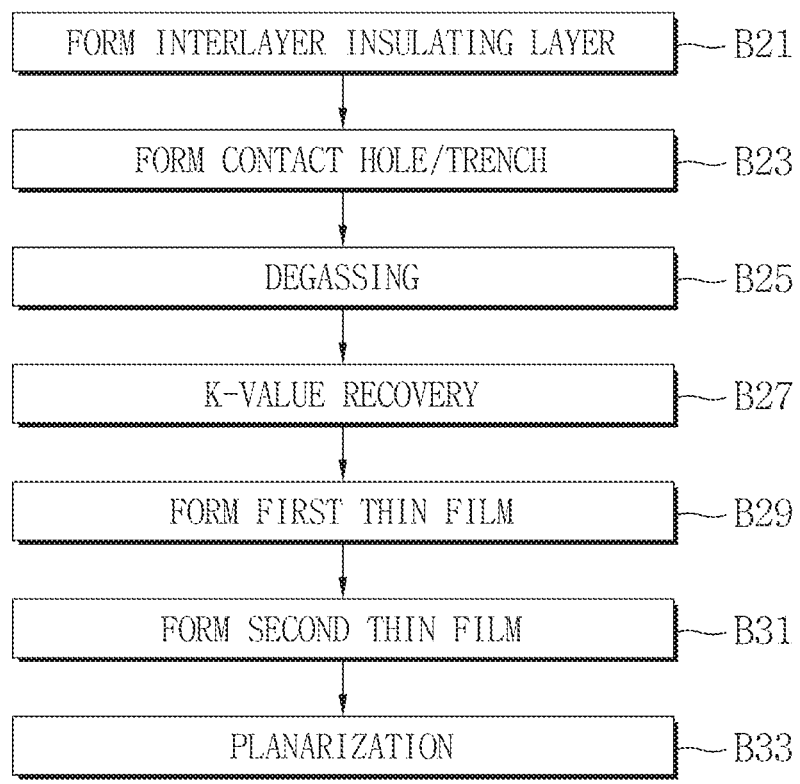
FIG. 1 is a flowchart for describing a method of fabricating a semiconductor device in accordance with an example embodiment of the inventive concepts.

Advantages and features of the inventive concepts and methods of accomplishing them will be made apparent with reference to the accompanying drawings and some embodiments to be described below. The inventive concepts may, however, be embodied in various different forms, and should be construed as limited, not by the example embodiments set forth herein, but only by the accompanying claims. Rather, these example embodiments are provided so that this disclosure is thorough and complete and fully conveys the inventive concepts to those skilled in the art.

The terminology used herein is for the purpose of describing particular embodiments only and is not intended to be limiting of the inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected or coupled to the other element or layer or intervening elements or layers may be present. In contrast, when an element is referred to as being "directly on," "directly connected to," or "directly coupled to" another element or layer, there are no intervening elements or layers present. As used herein, the term "and/or" includes any and all combinations of one or more of the associated listed items. Further, it will be understood that when a layer is referred to as being "under" another layer, it can be directly under or one or more intervening layers may also be present. In addition, it will also be understood that when a layer is referred to as being "between" two layers, it can be the only layer between the two layers, or one or more intervening layers may also be present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

In the drawing figures, the dimensions of layers and regions may be exaggerated for clarity of illustration. Like reference numerals refer to like elements throughout. The same reference numbers indicate the same components throughout the specification.

Spatially relative terms, such as "beneath," "below," "lower," "above," "upper," and the like, may be used herein for ease of description in describing one element's or feature's relationship to another/other element(s) or feature (s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The example embodiments of the invention will be described with reference to cross-sectional views and/or plan views which are example views. Thicknesses of layers and areas are exaggerated for effective description of the technical contents in the drawings. Forms of the embodiments may be modified by the manufacturing technology and/or tolerance. Therefore, the embodiments of the invention are not intended to be limited to illustrated specific forms, and include modifications of forms generated according to manufacturing processes. For example, an etching area illustrated at a right angle may be round or have a desired, or alternatively predetermined curvature. Therefore, areas illustrated in the drawings have overview properties, and shapes of the areas are illustrated special forms of the areas of a device, and are not intended to be limited to the scope of the invention.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein. As used herein, expressions such as "at least one of," when preceding a list of elements, modify the entire list of elements and do not modify the individual elements of the list.

When the terms "about" or "substantially" are used in this specification in connection with a numerical value, it is intended that the associated numerical value include a tolerance of ±10% around the stated numerical value. Moreover, when reference is made to percentages in this specification, it is intended that those percentages are based on weight, i.e., weight percentages. The expression "up to" includes amounts of zero to the expressed upper limit and all values therebetween. When ranges are specified, the range includes all values therebetween such as increments of 0.1%. Moreover, when the words "generally" and "substantially" are used in connection with geometric shapes, it is intended that precision of the geometric shape is not required but that latitude for the shape is within the scope of the disclosure. Although the tubular elements of the embodiments may be cylindrical, other tubular cross-sectional forms are contemplated, such as square, rectangular, oval, triangular and others.

Like numbers refer to like elements throughout. Thus, the same or similar or same numbers may be described with reference to other drawings even if they are neither mentioned nor described in the corresponding drawing. Also, elements that are not denoted by reference numbers may be described with reference to other drawings.

Terms such as "front side" and "back side" may be used in a relative sense herein to facilitate easy understanding of the inventive concepts. Accordingly, "front side" and "back side" may not refer to any specific direction, location, or component, and may be used interchangeably. For example, a "front side" may be interpreted as a "back side" and vice versa. In addition, "front side" may be expressed as "first side," and "back side" may be expressed as "second side," and vice versa. However, "front side" and "back side" cannot be used interchangeably in the same embodiment.

The term "near" is intended to mean that one among two or more components is located within relatively close proximity of a certain other component. For example, it should be understood that when a first end is near a first side, the first end may be closer to the first side than a second end, or the first end may be closer to the first side than to a second side.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

FIG. 1 is a flowchart for describing a method of fabricating a semiconductor device in accordance with an example embodiment of the inventive concepts.

Referring to FIG. 1, the method of fabricating a semiconductor device in accordance with the example embodiment of the inventive concepts may include forming an interlayer insulating layer (B21), forming a contact hole and a trench (B23), performing a degassing process (B25), performing a K-value recovery process (B27), forming a first thin film (B29), forming a second thin film (B31), and performing a planarization process (B33).

Figure 2:
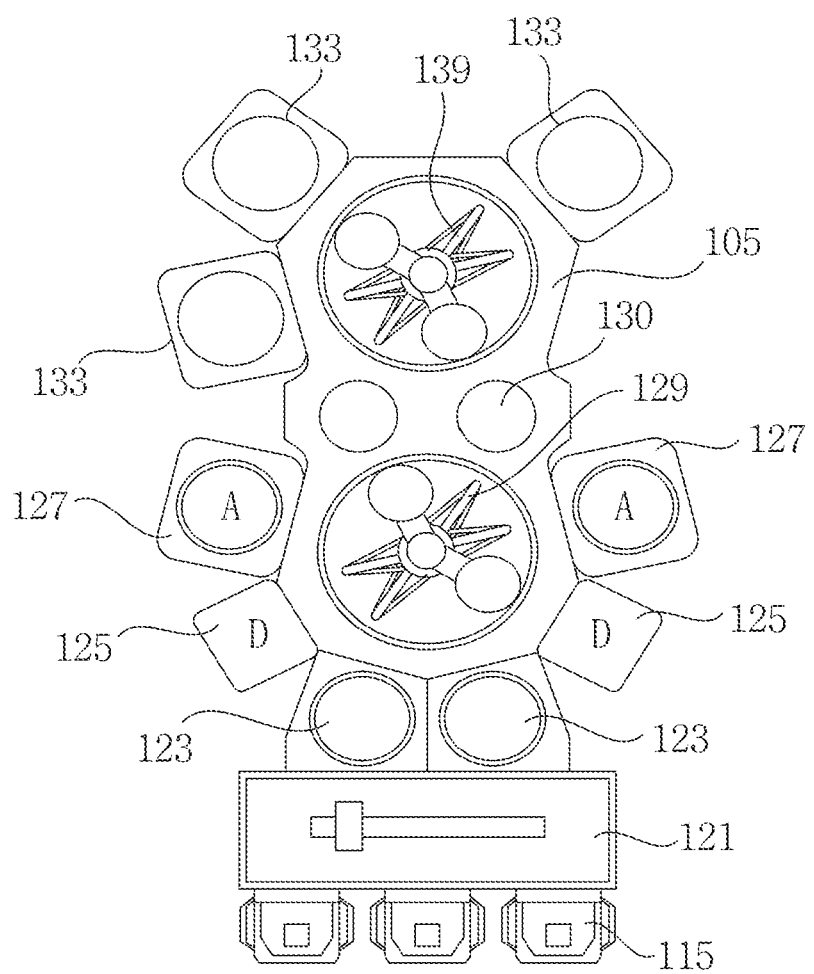
FIG. 2 is a layout for describing a semiconductor manufacturing system in accordance with an example embodiment of the inventive concepts.

FIG. 2 is a layout for describing a semiconductor manufacturing system in accordance with an example embodiment of the inventive concepts.

Referring to FIG. 2, the semiconductor manufacturing system in accordance with the example embodiment of the inventive concepts may include a main chamber 105, a cassette stage 115, an inlet 121, a load lock chamber 123, a degasser 125, an after-plasma-condition (APC) apparatus 127, a first transfer apparatus 129, a cooling station 130, a process chamber 133, and a second transfer apparatus 139.

In example embodiments, the cassette stage 115 may be disposed in an outer side of the main chamber 105. The load lock chamber 123 may be installed on a sidewall of the main chamber 105. The inlet 121 may be formed between the cassette stage 115 and the load lock chamber 123. The inside of the main chamber 105 may be maintained at, for example, a low pressure state or a vacuum state. The load lock chamber 123 may be configured to reduce or substantially prevent loss of internal pressure of the main chamber 105. For example, the load lock chamber 123 may be a single-wafer load lock chamber.

The degasser 125 may be installed on a sidewall of the main chamber 105. The degasser 125 may be disposed between the load lock chamber 123 and the APC apparatus 127. The APC apparatus 127 may be installed on a sidewall of the main chamber 105. The APC apparatus 127 may be disposed between the degasser 125 and the cooling station 130. The first transfer apparatus 129 may be installed in the main chamber 105. The first transfer apparatus 129 may be formed to be adjacent to the load lock chamber 123, the degasser 125, the APC apparatus 127, and the cooling station 130. The process chamber 133 may be installed on a sidewall of the main chamber 105. The second transfer apparatus 139 may be installed in the main chamber 105. The second transfer apparatus 139 may be disposed to be adjacent to the process chamber 133 and the cooling station 130.

FIGS. 3 to 6 are cross-sectional views illustrating some configurations of a semiconductor device system in accordance with an example embodiment of the inventive concepts.

Figure 3:
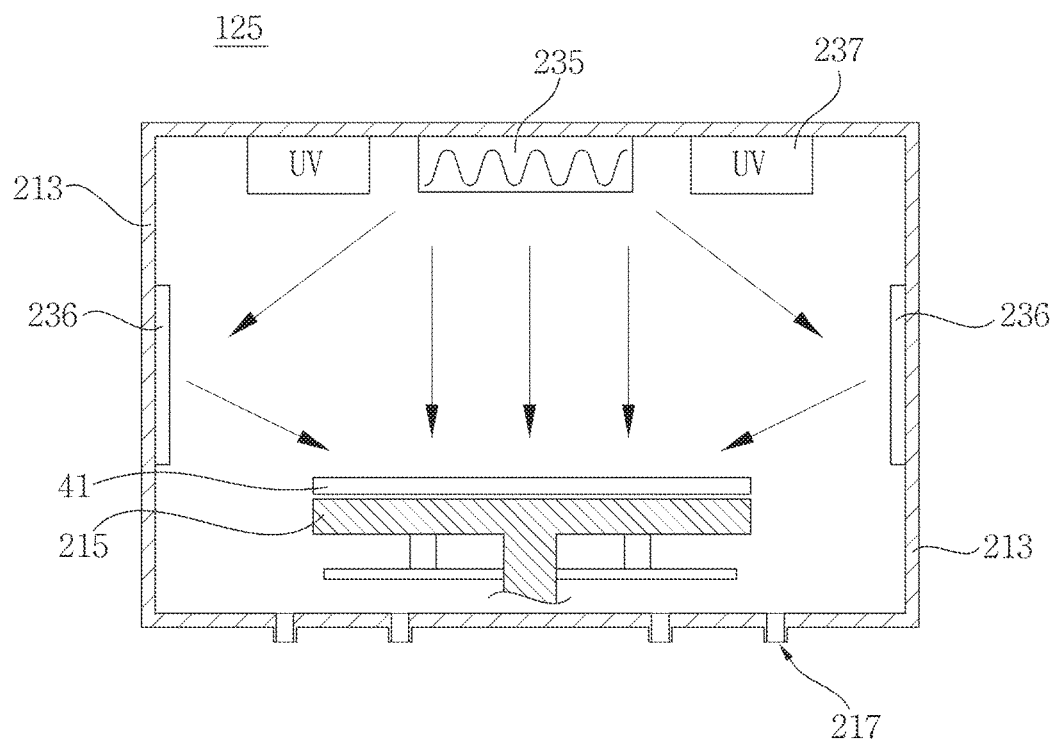
FIGS. 3 to 6 are cross-sectional views illustrating some configurations of a semiconductor manufacturing system in accordance with an example embodiment of the inventive concepts.

Referring to FIG. 3, the degasser 125 may include a chamber 213, a stage 215, an outlet 217, a microwave generator 235, a reflector 236, and a UV radiator 237. The microwave generator 235 may be configured to radiate microwaves to a substrate 41.

The stage 215 may be installed in the chamber 213. The substrate 41 may be loaded on the stage 215. The stage 215 may include a heater for heating the substrate 41. For example, the stage 215 may be configured to heat the substrate 41 to a temperature of 50 to 200° C. The outlet 217 may be formed at a bottom or a side surface of the chamber 213. For example, the outlet 217 may be formed at the bottom of the chamber 213 adjacent to the stage 215. The outlet 217 may be configured to maintain an internal pressure of the chamber 213 and discharge processing byproducts existing in the chamber 213.

The microwave generator 235 may be installed on a side surface or a ceiling of the chamber 213. For example, the microwave generator 235 may be disposed on the ceiling of the chamber 213 and aligned to face the substrate 41. The microwave generator 235 may be configured to radiate microwaves to the substrate 41. For example, the microwave generator 235 may radiate microwaves of about 2400 MHz to about 9900 MHz to the substrate 41. The reflector 236 may be installed on a side surface, a bottom, a ceiling, or combinations thereof. For example, the reflector 236 may be installed on the side surface of the chamber 213. The reflector 236 may reflect microwaves and increase efficiency of microwaves radiated to the substrate 41.

Figure 4:
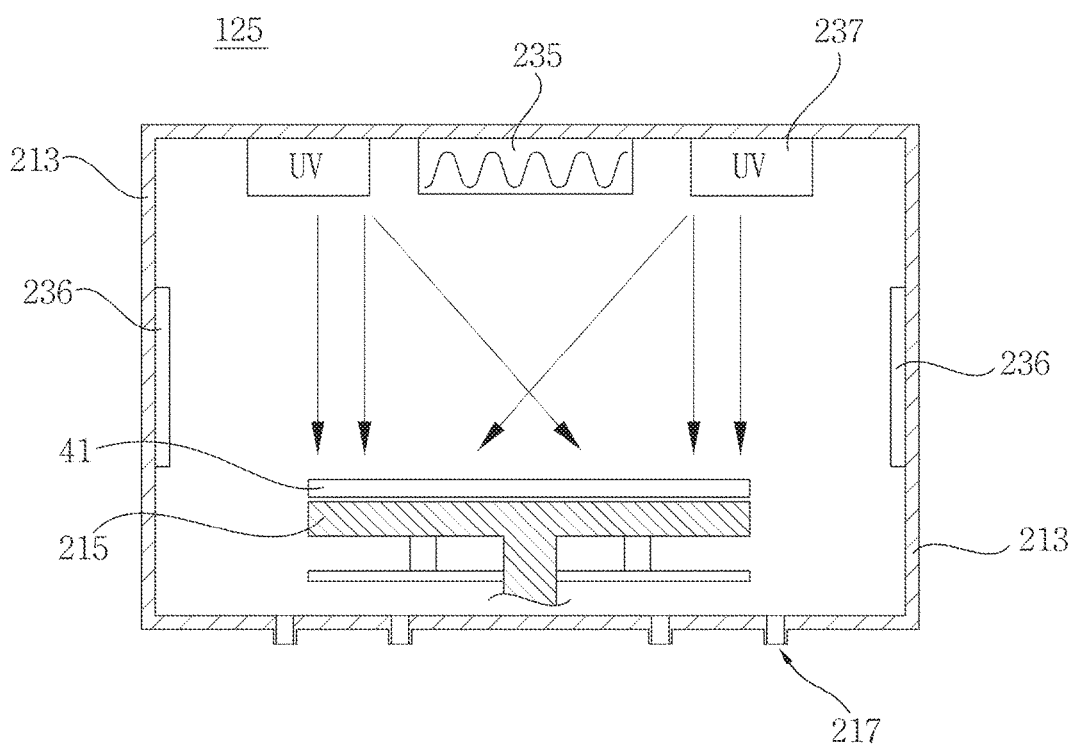

Referring to FIG. 4, the UV radiator 237 may be installed on the side surface or ceiling of the chamber 213. For example, the UV radiator 237 may be disposed on the ceiling of the chamber 213 and aligned to face the substrate 41. The UV radiator 237 may be configured to radiate UV light to the substrate 41.

Figure 5:
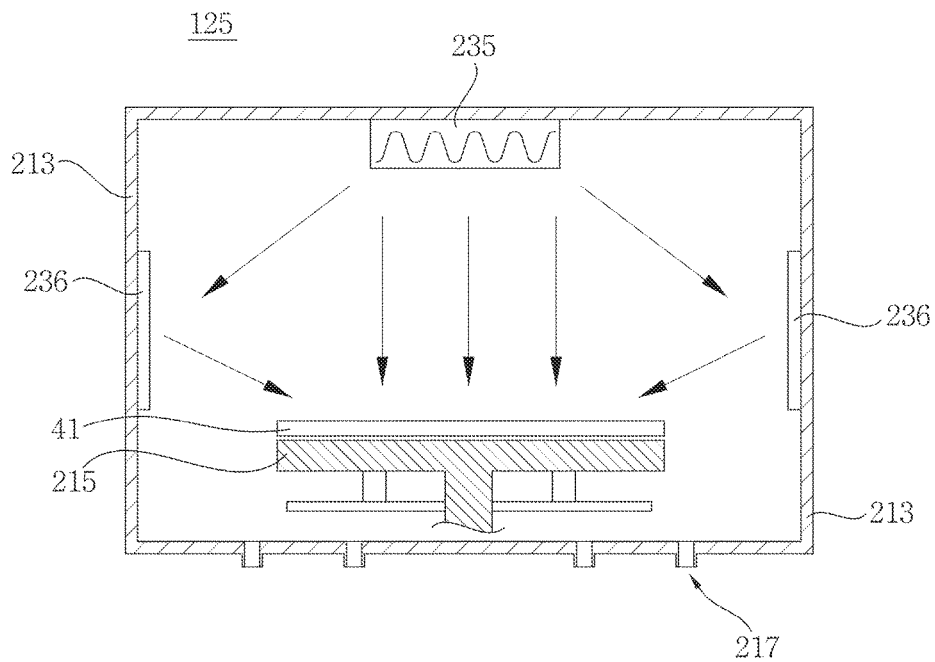

Referring to FIG. 5, the degasser 125 may include a chamber 213, a stage 215, an outlet 217, a microwave generator 235, and a reflector 236.

Figure 6:
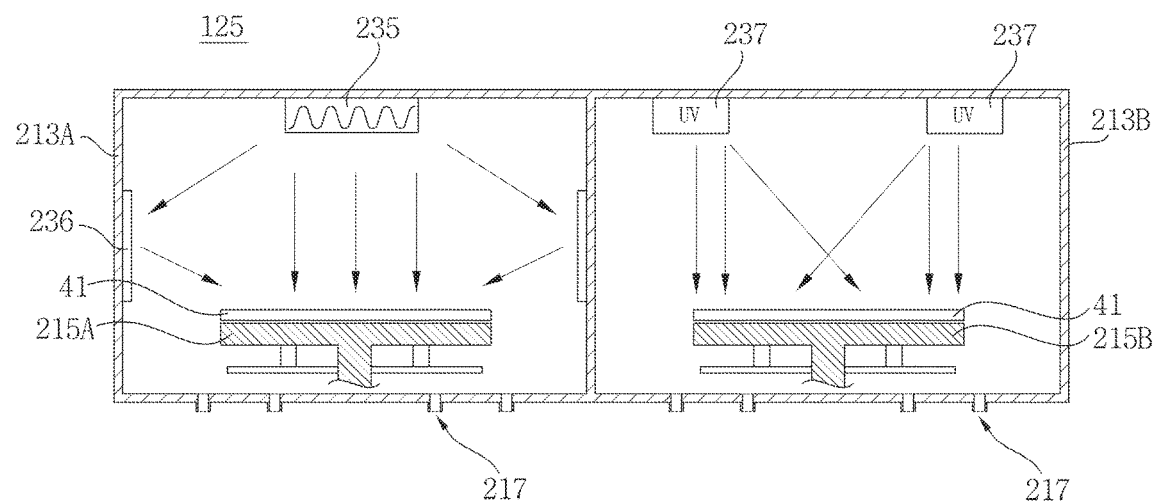

Referring to FIG. 6, the degasser 125 may include a first chamber 213A, a second chamber 213B, a first stage 215A, a second stage 215B, an outlet 217, a microwave generator 235, a reflector 236, and a UV radiator 237. The second chamber 213B may be disposed at one side of the first chamber 213A. The first stage 215A, the microwave generator 235, and the reflector 236 may be installed in the first chamber 213A. The second stage 215B and the UV radiator 237 may be installed in the second chamber 213B.

In example embodiments, the second chamber 213B may be disposed on a side of the APC apparatus 127 or the process chamber 133.

In example embodiments, the UV radiator 237 may be installed in the APC apparatus 127 or the process chamber 133.

FIGS. 7 to 13 are cross-sectional views for describing a method of fabricating a semiconductor device in accordance with an example embodiment of the inventive concepts.

Figure 7:
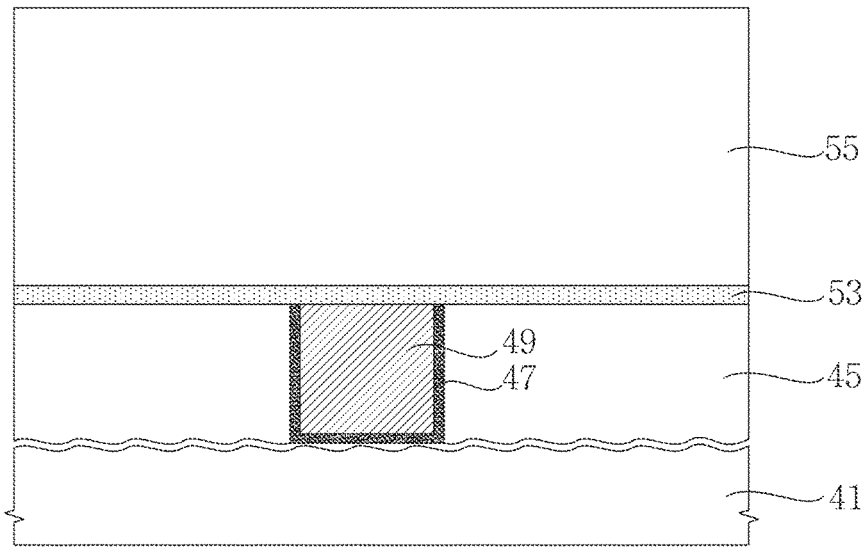
FIGS. 7 to 13 are cross-sectional views for describing a method of fabricating a semiconductor device in accordance with an example embodiment of the inventive concepts.

Referring to FIGS. 1 and 7, a lower insulating layer 45, a lower barrier layer 47, a lower conductive pattern 49, an etch-stopping layer 53, and an interlayer insulating layer 55 may be formed on a substrate 41 (B21).

The substrate 41 may be a semiconductor substrate, such as a silicon wafer or a silicon-on-insulator (SOI) wafer. The lower insulating layer 45 may cover the substrate 41. The lower insulating layer 45 may include an insulating layer, such as silicon oxide, silicon nitride, silicon oxynitride, or a combination thereof. The lower barrier layer 47 and the lower conductive pattern 49 may be formed in the lower insulating layer 45. The lower barrier layer 47 may surround bottom and side surfaces of the lower conductive pattern 49. The formation of the lower barrier layer 47 and the lower conductive pattern 49 may include a thin-film formation process and a planarization process. The planarization process may include a chemical mechanical polishing (CMP) process, an etch-back process, or a combination thereof. Upper surfaces of the lower barrier layer 47, the lower conductive pattern 49, and the lower insulating layer 45 may be substantially coplanar.

The lower barrier layer 47 and the lower conductive pattern 49 may include a conductive material, such as a metal, a metal silicide, a metal nitride, a metal oxide, polysilicon, conductive carbon, or a combination thereof. For example, the lower barrier layer 47 may include Ti/TiN. The lower conductive pattern 49 may include W, WN, Ti, TiN, TiAl, TiAlC, Ta, TaN, Ni, Co, Mn, Al, Mo, Ru, Pt, Ag, Au, Cu, conductive carbon, or a combination thereof.

The etch-stopping layer 53 may cover the lower barrier layer 47, the lower conductive pattern 49, and the lower insulating layer 45. The interlayer insulating layer 55 may be formed on the etch-stopping layer 53. The interlayer insulating layer 55 may include an insulating layer, such as silicon oxide, silicon nitride, silicon oxynitride, a low-K dielectric material, or a combination thereof. The etch-stopping layer 53 may include a material having an etching selectivity with respect to the interlayer insulating layer 55. For example, the etch-stopping layer 53 may include silicon nitride, and the interlayer insulating layer 55 may include a low-K dielectric material. The interlayer insulating layer 55 may include a porous material layer.

Figure 8:
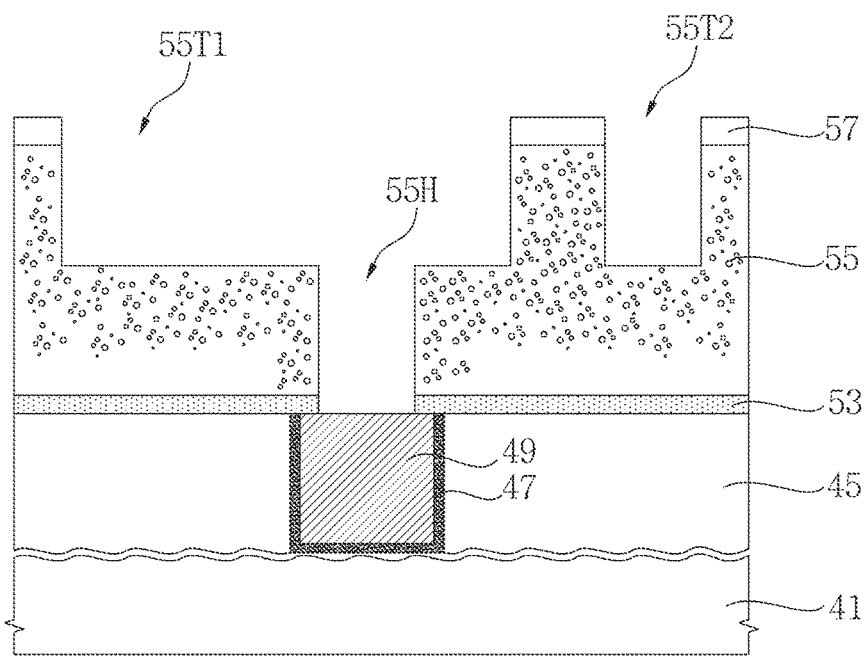
Figure 9:
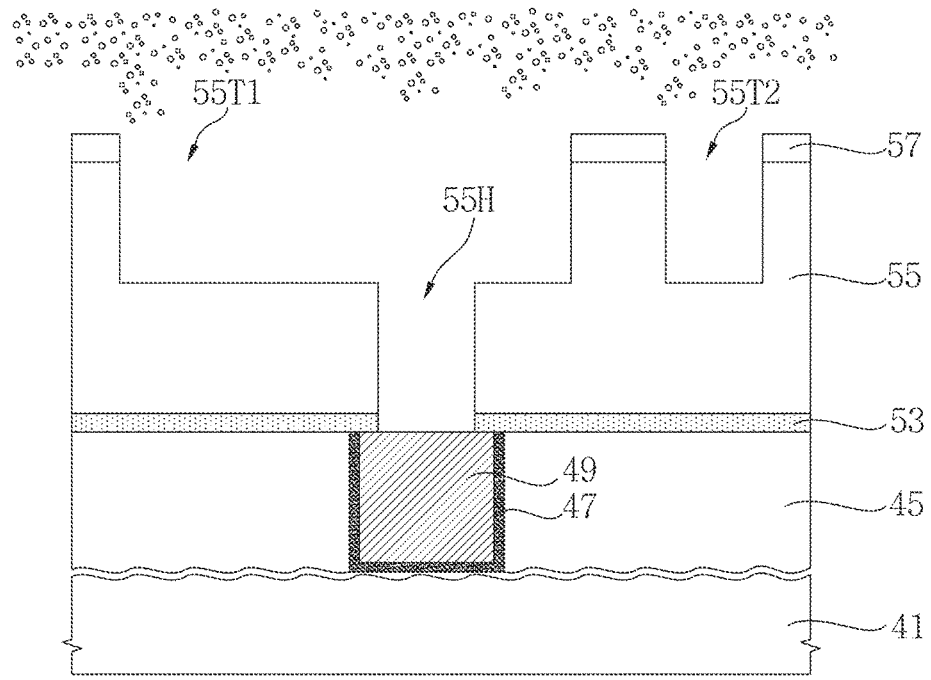

Referring to FIGS. 1 and 8, a hardmask 57 and openings 55H, 55T1, and 55T2 may be formed (B23). The openings 55H, 55T1, and 55T2 may include a contact hole 55H, a first trench 55T1, and a second trench 55T2.

The hardmask 57 may be formed on the interlayer insulating layer 55. The hardmask 57 may include an insulating material having an etching selectively with respect to the interlayer insulating layer 55. The openings 55H, 55T1, and 55T2 may be formed using an anisotropic etching process using the hardmask 57 as an etch mask. While the openings 55H, 55T1, and 55T2 are formed, moisture may penetrate into the interlayer insulating layer 55. The first trench 55T1 and the second trench 55T2 may be formed in the interlayer insulating layer 55. The interlayer insulating layer 55 may be exposed on sidewalls and bottoms of the first trench 55T1 and the second trench 55T2. The contact hole 55H may be connected to a lower portion of the first trench 55T1, and may pass through the interlayer insulating layer 55 and the etch-stopping layer 53 and expose the lower conductive pattern 49. The interlayer insulating layer 55 and the etch-stopping layer 53 may be exposed on sidewalls of the contact hole 55H.

In example embodiments, the hardmask 57 may be removed.

Referring to FIGS. 1 to 6 and FIG. 9, a degassing process may be performed (B25).

For example, the substrate 41 may be loaded on the stage 215 in the degasser 125 via the cassette stage 115, the inlet 121, the load lock chamber 123, and the first transfer apparatus 129. The substrate 41 may be heated to a temperature of about 50° C. to about 200° C. by the stage 215. The degassing process (B25) may include radiating microwaves to the substrate 41 using the microwave generator 235. While the degassing process (B25) is performed, the moisture in the interlayer insulating layer 55 may be fully removed.

The microwave generator 235 may radiate microwaves having, for example, a first frequency, which is effective to remove moisture deep inside the interlayer insulating layer 55, a second frequency, which is effective to remove moisture on a surface of the interlayer insulating layer 55 and inner walls of the openings 55H, 55T1, and 55T2, and/or a multi frequency, which is effective to remove the moisture on the surface and inside of the interlayer insulating layer 55, to the substrate 41. The first frequency may be in the range of about 2400 MHz to about 2500 MHz. For example, the first frequency may be about 2450 MHz. The second frequency may be in the range of about 8500 MHz to about 9500 MHz. For example, the second frequency may be about 9000 MHz. The multi frequency may be in the range of about 2400 MHz to about 9900 MHz.

In example embodiments, the degassing process (B25) may include radiating the microwaves having the first frequency to the substrate 41 for a desired, or alternatively predetermined amount of time, and then radiating the microwaves having the second frequency to the substrate 41 for a desired, or alternatively predetermined amount of time.

In example embodiments, the degassing process (B25) may include radiating the microwaves having the second frequency to the substrate 41 for a desired, or alternatively predetermined amount of time.

In example embodiments, the degassing process (B25) may include radiating the microwaves having the multi frequency to the substrate 41 for a desired, or alternatively predetermined amount of time.

In example embodiments, the degassing process (B25) may include radiating the microwaves having the second frequency to the substrate 41 for a desired, or alternatively predetermined amount of time, and then radiating the microwaves having the first frequency to the substrate 41 for a desired, or alternatively predetermined amount of time.

In example embodiments, the degassing process (B25) may include radiating the microwaves having the first frequency to the substrate 41 for a desired, or alternatively predetermined amount of time.

In example embodiments, the degassing process (B25) may include alternately repeating the process of radiating the microwaves having the first frequency to the substrate 41 for a desired, or alternatively predetermined amount of time and the process of radiating the microwaves having the second frequency to the substrate 41 for a desired, or alternatively predetermined amount of time.

In example embodiments, the degassing process (B25) may include alternately repeating the process of radiating the microwaves having the second frequency to the substrate 41 for a desired, or alternatively predetermined amount of time and the process of radiating the microwaves having the first frequency to the substrate 41 for a desired, or alternatively predetermined amount of time.

In accordance with example embodiments of the inventive concepts, the degassing process (B25) using microwaves may enable to effectively remove moisture in a relatively short time, compared to a typical process using a halogen lamp or UV light. The degassing process (B25) may increase the production efficiency.

A K-value recovery process may be performed (B27).

The K-value recovery process (B27) may include radiating UV light to the substrate 41 using the UV radiator 237. While performing the K-value recovery process (B27), damaged portions of the interlayer insulating layer 55 may be recovered and the K-value may be recovered.

The degassing process (B25) and the K-value recovery process (B27) may be sequentially performed in the chamber 213. The degassing process (B25) and the K-value recovery process (B27) may be interpreted as an in-situ process.

In example embodiments, the degassing process (B25) may be performed in the first chamber 213A, and the K-value recovery process (B27) may be performed in the second chamber 213B, in sequence. The degassing process (B25) and the K-value recovery process (B27) may be interpreted as an in-situ process.

In example embodiments, the degassing process (B25) and the K-value recovery process (B27) may be alternately and repeatedly performed.

In accordance with example embodiments of the inventive concepts, the degassing process (B25) and the K-value recovery process (B27) may be performed as an in-situ process. Since resorption of moisture occurring between the degassing process (B25) and the K-value recovery process (B27) is reduced or substantially prevented, efficiency of K-value recovery in the K-value recovery process (B27) may be improved. A semiconductor device having improved electrical properties may be implemented.

A surface of the substrate 41 may be cleaned using the APC apparatus 127. The first transfer apparatus 129 may be configured to transfer the substrate 41 between the degasser 125 and the APC apparatus 127. When the process of cleaning the surface of the substrate 41 using the APC apparatus 127 is finished, the substrate 41 may be transferred to the cooling station 130 via the first transfer apparatus 129.

In example embodiments, the degassing process (B25), the K-value recovery process (B27), and the process of cleaning the surface of the substrate 41 using the APC apparatus 127 may be sequentially performed. The degasser 125 and the APC apparatus 127 may be installed in the main chamber 105. The degassing process (B25), the K-value recovery process (B27), and the process of cleaning the surface of the substrate 41 using the APC apparatus 127 may be interpreted as an in-situ process.

In example embodiments, the UV radiator 237 may be installed in the APC apparatus 127.

In example embodiments, the process of cleaning the surface of the substrate 41 using the APC apparatus 127 may be omitted.

Figure 10:
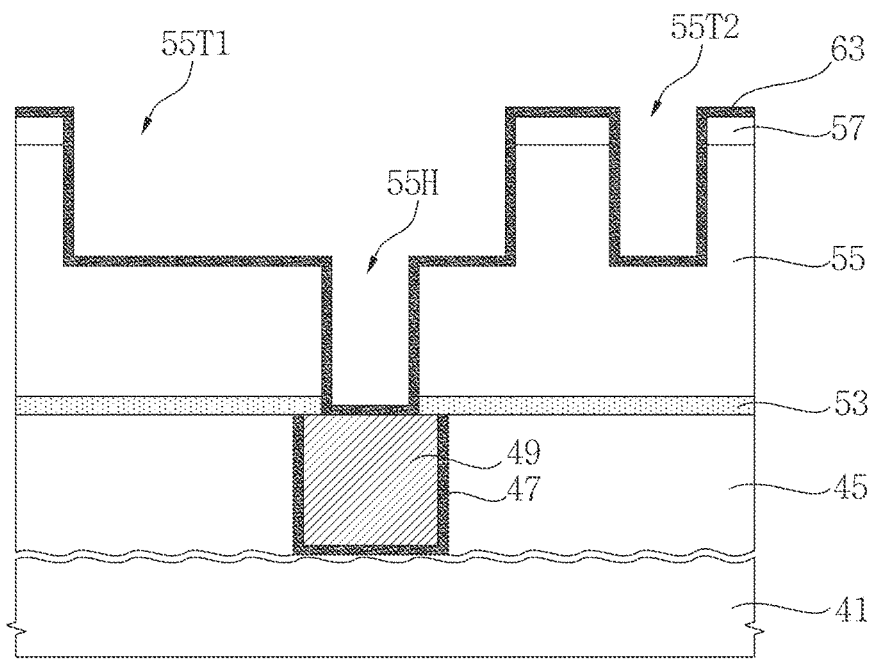

Referring to FIGS. 1, 2, and 10, an upper barrier layer 63 may be formed (B29). The upper barrier layer 63 may be interpreted as a first thin film. The upper barrier layer 63 may include a conductive material, such as a metal, a metal silicide, a metal nitride, a metal oxide, polysilicon, conductive carbon, or a combination thereof. For example, the upper barrier layer 63 may include Ti/TiN. The upper barrier layer 63 may conformally cover inner walls of the contact hole 55H, the first trench 55T1, and the second trench 55T2. The upper barrier layer 63 may be in contact, for example in direct contact, with the lower conductive pattern 49.

For example, the second transfer apparatus 139 may be configured to transfer the substrate 41 disposed on the cooling station 130 to the inside of the process chamber 133. The process chamber 133 may be configured to form the upper barrier layer 63 on the substrate 41.

In example embodiments, the degassing process (B25), the K-value recovery process (B27), the process of cleaning the surface of the substrate 41 using the APC apparatus 127, and the process of forming the upper barrier layer 63 (B29) may be sequentially performed. The degasser 125, the APC apparatus 127, and the process chamber 133 may be installed in the main chamber 105. The degassing process (B25), the K-value recovery process (B27), the process of cleaning the surface of the substrate 41 using the APC apparatus 127, and the process of forming the upper barrier layer 63 (B29) may be interpreted as an in-situ process.

In example embodiments, the UV radiator 237 may be installed in the process chamber 133. The process of cleaning the surface of the substrate 41 using the APC apparatus 127 may be omitted.

In accordance with an example embodiment of the inventive concepts, the degassing process (B25), the K-value recovery process (B27), the process of cleaning the surface of the substrate 41 using the APC apparatus 127, and the process of forming the upper barrier layer 63 (B29) may be performed as an in-situ process. Accordingly, the resorption of moisture occurring between the degassing process (B25), the K-value recovery process (B27), the process of cleaning the surface of the substrate 41 using the APC apparatus 127, and the process of forming the upper barrier layer 63 (B29) may be reduced or substantially prevented. A semiconductor device having improved production efficiency and improved electric characteristics may be implemented.

Figure 11:
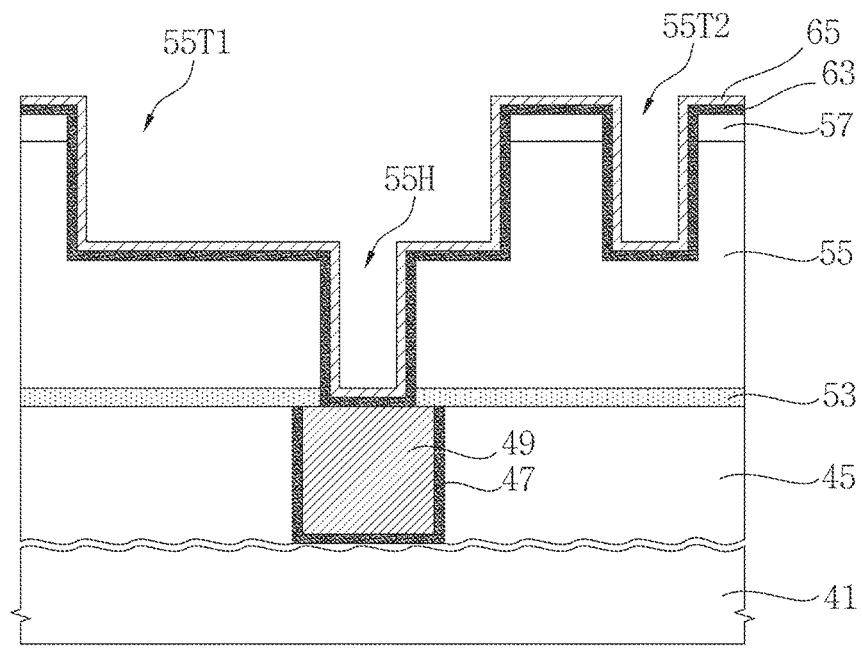

Referring to FIG. 11, a seed layer 65 may be formed on the upper barrier layer 63. The seed layer 65 may include a conductive material, such as a metal, a metal nitride, a metal oxide, conductive carbon, or a combination thereof. For example, the seed layer 65 may include Cu. The seed layer 65 may conformally cover the upper barrier layer 63. The seed layer 65 may conformally cover the surface of the substrate 41. The seed layer 65 may be formed using the process chamber 133.

In example embodiments, the seed layer 65 may be omitted.

The substrate 41 may be returned to the cassette stage 115 via the inlet 121.

Figure 12:
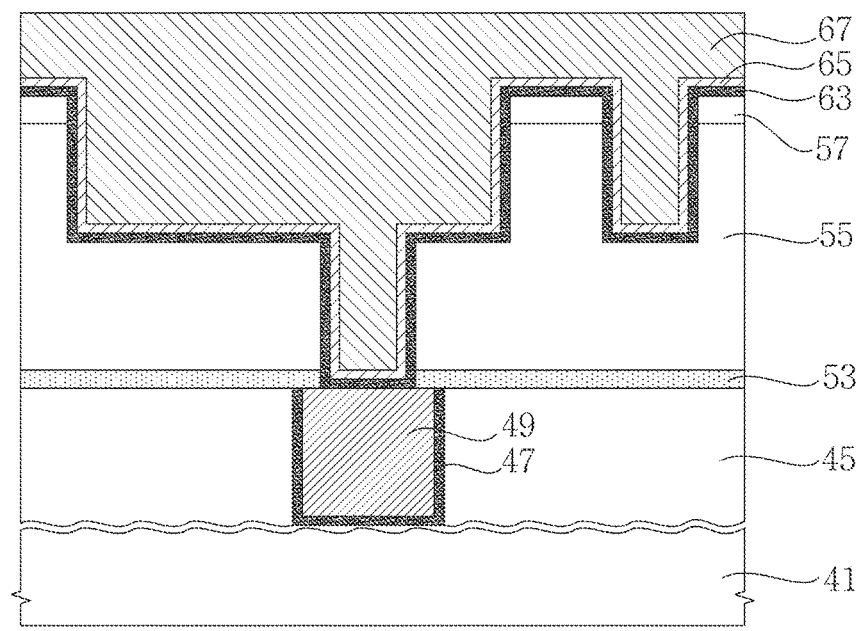

Referring to FIG. 12, a low resistance layer 67 may be formed on the seed layer 65 (B31). The low resistance layer 67 may be interpreted as a second thin film. The low resistance layer 67 may include a conductive material, such as a metal, a metal silicide, a metal nitride, a metal oxide, polysilicon, conductive carbon, or a combination thereof. For example, the low resistance layer 67 may include Cu formed by an electroplating method. The low resistance layer 67 may fully fill the contact hole 55H, the first trench 55T1, and the second trench 55T2.

Figure 13:
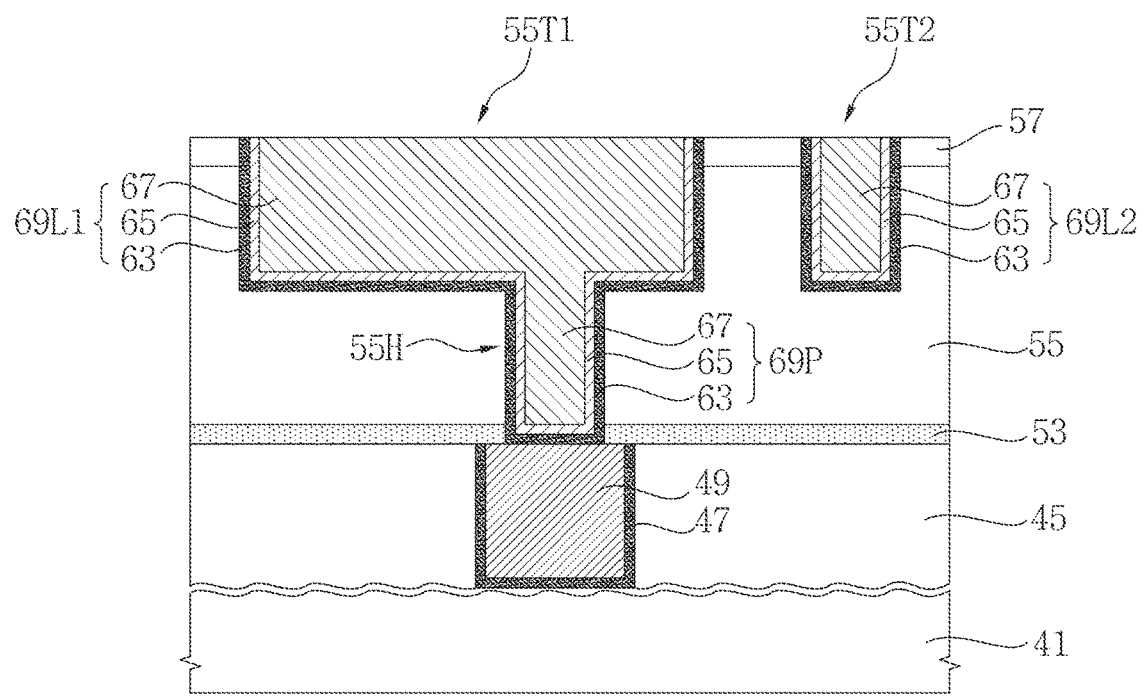

Referring to FIG. 13, a contact plug 69P, a first interconnection 69L1, and a second interconnection 69L2 may be formed in a planarization process (B33). The planarization process may include a CMP process, an etch-back process, or a combination thereof. Upper surfaces of the hardmask 57, the upper barrier layer 63, the seed layer 65, and the low resistance layer 67 may be substantially coplanar.

The contact plug 69P may be formed in the contact hole 55H. The contact plug 69P may include the upper barrier layer 63, the seed layer 65, and the low resistance layer 67. The first interconnection 69L1 may be formed in the first trench 55T1. The first interconnection 69L1 may include the upper barrier layer 63, the seed layer 65, and the low resistance layer 67. The second interconnection 69L2 may be formed in the second trench 55T2. The second interconnection 69L2 may include the upper barrier layer 63, the seed layer 65, and the low resistance layer 67.

In example embodiments, the hardmask 57 may be removed. Upper surfaces of the interlayer insulating layer 55, the upper barrier layer 63, the seed layer 65, and the low resistance layer 67 may be substantially coplanar.

As set forth above, in accordance with example embodiments of the inventive concepts, a conductive layer may be formed on an interlayer insulating layer after performing a degassing process using microwaves and performing a K-value recovery process using UV light. A process time of the degassing process may be reduced, while the efficiency of K-value recovery may be improved. A semiconductor device having improved production efficiency and improved electric characteristics may be implemented.

The foregoing was for illustration of example embodiments only and is not to be construed as limiting thereof. Although a few example embodiments have been described, those skilled in the art will readily appreciate that many modifications are possible without materially departing from the novel teachings and advantages thereof.

What is claimed is:

1. A method of fabricating a semiconductor device, comprising:
    forming an interlayer insulating layer on a substrate;
    forming an opening in the interlayer insulating layer;
    performing a degassing process by irradiating the interlayer insulating layer having the opening with microwaves;
    performing a K-value recovery process by irradiating the interlayer insulating layer having the opening with UV light; and
    forming a conductive layer in the opening,
    wherein the degassing process and the K-value recovery process are performed in-situ in a same chamber.

2. The method of claim 1, wherein the degassing process is performed in a degasser including a microwave generator.

3. The method of claim 1, wherein the microwaves are in a range of about 2400 MHz to about 9900 MHz.

4. The method of claim 1, wherein the degassing process includes radiating microwaves having a first frequency to remove moisture inside the interlayer insulating layer.

5. The method of claim 4, wherein the first frequency is in a range of about 2400 MHz to about 2500 MHz.

6. The method of claim 4, further comprising:
    radiating microwaves having a second frequency to remove moisture adjacent to a surface of the interlayer insulating layer and inner walls of the opening.

7. The method of claim 6, wherein the second frequency is in a range of about 8500 MHz to about 9500 MHz.

8. The method of claim 6, wherein the radiating of microwaves having the first frequency and the radiating of microwaves having the second frequency are sequentially performed.

9. The method of claim 1, wherein the degassing process includes radiating microwaves having a frequency in the range of about 8500 MHz to about 9500 MHz to remove moisture adjacent to a surface of the interlayer insulating layer and inner walls of the opening.

10. The method of claim 1, wherein the degassing process, the K-value recovery process, and the forming of the conductive layer are performed in-situ.

11. The method of claim 1, further comprising:
    cleaning the substrate using an after-plasma-condition (APC) apparatus before forming the conductive layer,
    wherein the degassing process, the K-value recovery process, the cleaning of the substrate, and the forming of the conductive layer are performed in-situ.

12. The method of claim 1, wherein
    the K-value recovery process is performed after the degassing process, and
    the degassing process is additionally performed after the K-value recovery process.

13. A method of fabricating a semiconductor device, comprising:
    forming an interlayer insulating layer on a substrate;

forming a contact hole passing through the interlayer insulating layer;
performing a degassing process by irradiating the interlayer insulating layer having the contact hole with microwaves;
cleaning the substrate using an after-plasma-condition (APC) apparatus; and
forming a conductive layer in the contact hole,
wherein the degassing process, the cleaning the substrate and the forming of the conductive layer are performed in-situ.

14. The method of claim 13, further comprising:
performing a K-value recovery process by irradiating the interlayer insulating layer having the contact hole with UV light,
wherein the degassing process and the K-value recovery process are performed in-situ.

15. A method, comprising:
irradiating an interlayer insulating layer with microwave radiation in a chamber; and
irradiating the interlayer insulating layer with UV light in the chamber;
wherein the irradiating the interlayer insulating layer with microwave radiation and the irradiating the interlayer insulating layer with UV light are performed in-situ.

16. The method of claim 15, wherein the microwave radiation includes radiation in a range of about 2400 MHz to about 9900 MHz.

17. The method of claim 16, wherein the irradiating the interlayer insulating layer with microwave radiation comprises irradiating the interlayer insulating layer with a combination of radiation in a first frequency range and in a second frequency range.

18. The method of claim 17, wherein the first frequency range is about 2400 MHz to about 2500 MHz, and the second frequency range is about 8500 MHz to about 9500 MHz.

* * * * *